(12) United States Patent
Chiu et al.

(10) Patent No.: US 7,693,493 B2
(45) Date of Patent: Apr. 6, 2010

(54) REDUCING AMPLITUDE MODULATED NOISE FOR A WIRELESS TRANSCEIVER

(75) Inventors: Scott Chiu, Folsom, CA (US); Marc Loyer, Sacramento, CA (US); Thomas J Barnes, Beaverton, OR (US); Rapp Jan, Hasselby (SE); Jimmy Carlsson, Vallingby (SE)

(73) Assignee: Intel Corporation, Santa Clara, CA (US)

( * ) Notice: Subject to any disclaimer, the term of this patent is extended or adjusted under 35 U.S.C. 154(b) by 500 days.

(21) Appl. No.: 11/771,374

(22) Filed: Jun. 29, 2007

(65) Prior Publication Data

US 2009/0003487 A1 Jan. 1, 2009

(51) Int. Cl.
*H04B 1/38* (2006.01)
(52) U.S. Cl. ........................................ 455/73
(58) Field of Classification Search .............. 455/41.1, 455/41.2, 73
See application file for complete search history.

(56) References Cited

U.S. PATENT DOCUMENTS

| | | | | |
|---|---|---|---|---|
| 6,137,429 A | * | 10/2000 | Chan et al. | 341/143 |
| 6,268,815 B1 | * | 7/2001 | Gustavsson et al. | 341/143 |
| 6,492,922 B1 | * | 12/2002 | New | 341/120 |
| 2007/0280369 A1 | * | 12/2007 | Reynolds | 375/267 |

OTHER PUBLICATIONS

"A novel offset compensation biquad switched-capacitor filter design" Li Qiang (ASIC adn System State Key Lab, Fudan University, Shang Hai, IEEE 2003).*
"A single-chip cmos tranceiver for UHF Mobile RFID reader" Ickjin Kwon IEEE Journal of Solid-State Circuits, vol. 43 No. 3 Mar. 2008.*
"A UHF Mobile RFID reader IC with Self-Leakage Canceller" Jeiyoung Lee 2007 IEEE RFIC Symposium.*

* cited by examiner

*Primary Examiner*—Matthew D Anderson
*Assistant Examiner*—David Bilodeau
(74) *Attorney, Agent, or Firm*—Cool Patent, P.C.; Kenneth J. Cool

(57) ABSTRACT

Mechanisms for reducing amplitude-modulated noise in a wireless transceiver are generally described. In one example, an apparatus includes a radio-frequency identification (RFID) transceiver, a digital-analog converter (DAC) coupled with the transceiver, a reconstruction filter coupled with the digital-analog converter, and hold logic associated with the reconstruction filter to enable the reconstruction filter to hold its output voltage.

12 Claims, 4 Drawing Sheets

REDUCING AMPLITUDE MODULATED NOISE FOR A WIRELESS TRANSCEIVER

TECHNICAL FIELD

Embodiments of the present invention are generally directed to the field of wireless communication and, more particularly, to reducing amplitude modulated noise for a wireless transceiver.

BACKGROUND

Generally, wireless transceivers include radio-frequency identification (RFID) transceivers, or interrogators, which are half-duplex devices that transmit amplitude modulated (AM) commands to interact and/or communicate with a tag or transponder, then switch to a mode of sending a continuous wave (CW) signal to receive back-scattered responses from the tag. Tag responses may include back-scatter modulation imposed on the interrogator's CW signal. A digital-to-analog converter (DAC) may enable the interrogator to set a precise output power level when transmitting a CW signal, but the DAC may also impose significant AM noise that limits receiver sensitivity.

BRIEF DESCRIPTION OF THE DRAWINGS

Embodiments of the present invention are illustrated by way of example, and not by way of limitation, in the figures of the accompanying drawings in which like reference numerals refer to similar elements and in which.

Figure 1:
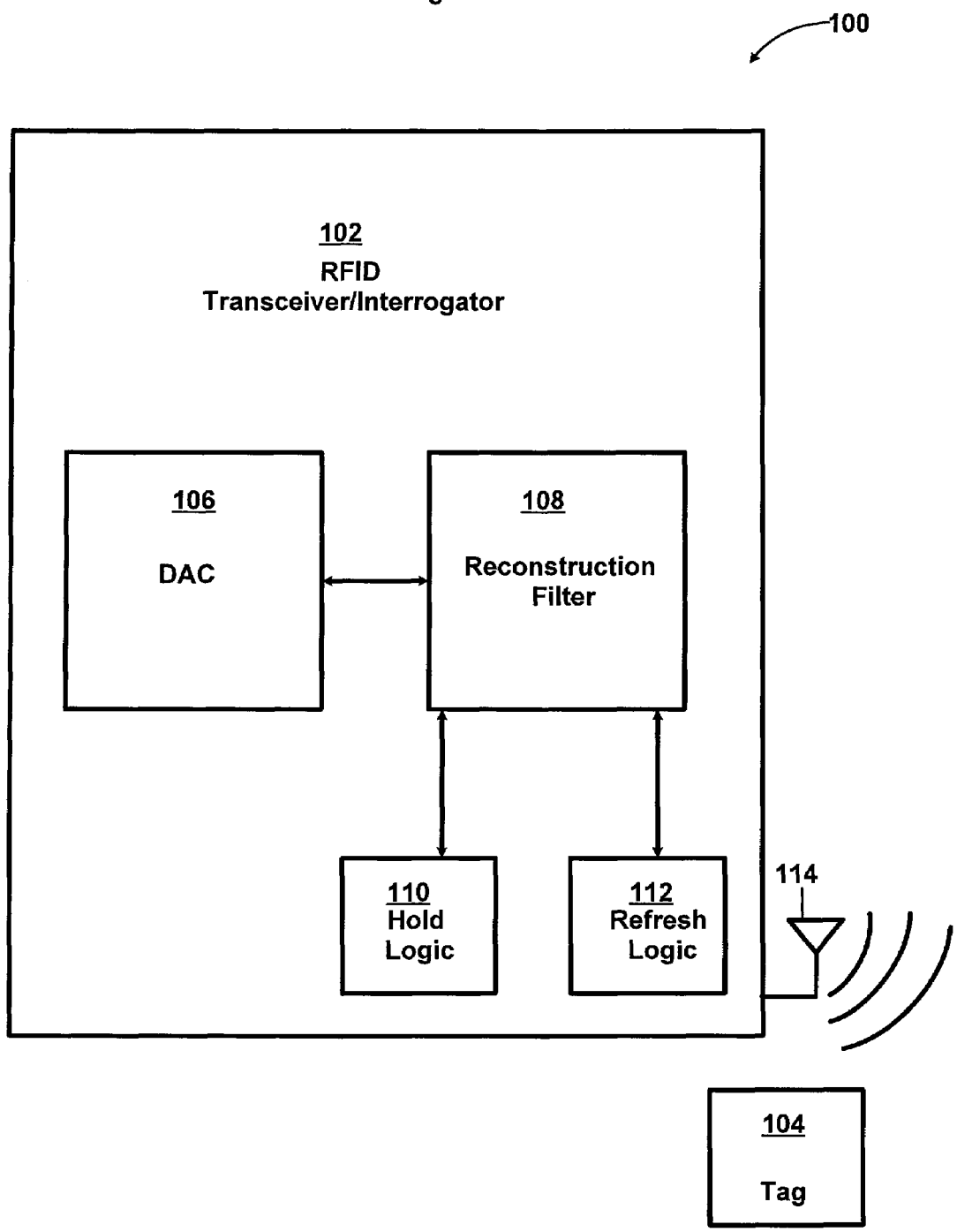
FIG. 1 is a diagram of an RFID apparatus, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of a method and associated apparatus for reducing amplitude-modulated noise in a wireless transceiver are described herein. In the following description, numerous specific details are set forth to provide a thorough understanding of embodiments of the invention. One skilled in the relevant art will recognize, however, that the invention can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a diagram of an RFID apparatus 100, according to but one embodiment. In one embodiment, apparatus 100 includes a wireless transceiver 102 such as RFID transceiver (or interrogator), one or more tag(s) 104, a DAC 106, a reconstruction filter 108, hold logic 110, refresh logic 112, and one or more antennae 114, each coupled as shown. In an embodiment, DAC 106, reconstruction filter 108, hold logic 110, and refresh logic 112 are components of RFID transceiver 102. In another embodiment, DAC 106, reconstruction, filter 108, hold logic 110, and refresh logic 112 are external elements coupled with transceiver 102. Although an RFID transceiver 102 is depicted in this embodiment, techniques described herein for reducing AM noise may be applied to other types of wireless transceivers as well.

In an embodiment, RFID transceiver 102 is a half-duplex device that transmits via antenna 114 amplitude modulated (AM) commands to interact and/or communicate with one or more tags or transponders 104, then switches to a mode of sending a continuous wave (CW) signal to receive back-scattered responses from the tag 104. Tag 104 responses may include back-scatter modulation imposed on the transceiver's 102 CW signal.

According to an embodiment, a digital-to-analog converter (DAC) 106 is coupled with the RFID transceiver 102 to enable the transceiver 102 to set a precise output power level when transmitting a CW signal, but the DAC 106 may also impose significant AM noise that limits receiver sensitivity. The DAC 106 may impose quantization noise that dominates the transmitter noise floor during CW transmission. In an embodiment, DAC 106 is a delta-sigma DAC. In other embodiments, any circuit 106 that creates AM noise is coupled with a wireless transceiver 102. Techniques disclosed herein for reducing AM noise may apply to other circuits 106 that impose AM noise.

In one embodiment, reconstruction filter 108 is coupled with the output of DAC 106 to smooth the signal from the DAC 106. Reconstruction filter 108 includes hold logic 110 in an embodiment. In another embodiment, filter 108 includes refresh logic 112. In yet another embodiment, filter 108 includes hold logic 110 and refresh logic 112. In an embodiment, hold logic 110 and refresh logic 112 enable the RFID transceiver 102 to reduce the DAC's 106 quantization noise while enabling the use of the DAC's 106 fine CW power control. In another embodiment, the hold logic 110 and refresh logic 112 are implemented when the RFID transceiver 102 is in CW mode.

In an embodiment, hold logic 110 is associated with the reconstruction filter 108 to enable the filter 108 to hold its output voltage. Hold logic 110 is implemented when the RFID transceiver 102 is in CW mode, according to an embodiment. According to an embodiment, the reconstruction filter 108 includes a capacitor that may be used to hold the filter 108 output voltage at an approximately constant value. Reusing an existing capacitor in the reconstruction filter 108 to hold the filter output voltage at an approximately constant value may reduce the cost of implementation. In another embodiment, sample-and-hold of the filter 108 output improves receiver 102 sensitivity.

According to an embodiment, refresh logic 112 is associated with the reconstruction filter 108 to periodically refresh the reconstruction filter connection with the DAC 106. In one embodiment, refresh logic 110 includes a programmable timer to refresh the reconstruction filter 108 by periodically reconnecting the reconstruction filter 108 to the DAC 106. In another embodiment, a programmable timer determines how often the filter 108 re-samples the DAC 106 output. The timer is reset when the transceiver 102 is not operating in CW mode according to an embodiment.

In other embodiments, one or more omnidirectional antennae 114 are coupled with the RFID transceiver 102 to transmit and receive a signal. In an example embodiment, a processor is coupled with the RFID transceiver 102 to communicate via the antenna 114. Additionally, other electronic components, elements, or systems may be coupled with the RFID transceiver 102. An example of such a system is shown and described with respect to FIG. 5.

Figure 2:
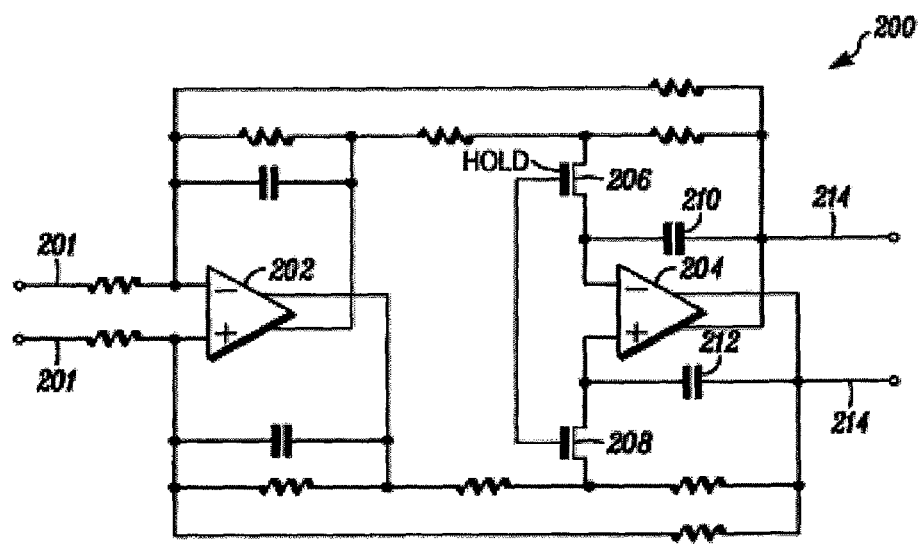
FIG. 2 is a circuit diagram of an example reconstruction filter biquad, according to but one embodiment.

FIG. 2 is a circuit diagram of an example reconstruction filter biquad 200 showing sample/hold connectivity, according to but one embodiment. In an embodiment, filter biquad 200 includes input voltage 201, amplifiers 202, 204, transistors 206, 208, capacitors 210, 212, and output voltage 214, each coupled as shown. Other capacitors and resistors may be arranged as depicted in biquad 200. In an embodiment, a reconstruction filter 108 as depicted and described in FIG. 1 includes biquad 200.

In an embodiment, input voltage 201 is an output from a DAC coupled with an RFID transceiver. The last stage or second order stage of biquad 200 includes amplifier 204, transistors 206, 208, capacitors 210, 212, output voltage 214, and associated resistors as shown in the illustrated embodiment 200. In an embodiment, the hold switch 206 is closed when an associated RFID transceiver transmits an AM signal and this stage behaves as a biquad. The hold switch 206 is open when an associated RFID transceiver transmits a CW signal and the output voltage 214 of the reconstruction filter is held constant or approximately constant, according to an embodiment. When the hold switch 206 is open and the RFID transceiver transmits a CW signal, the operational amplifier 204 acts as a hold amplifier to hold the output voltage 214 from changing due to load condition changes. In an embodiment, holding the output voltage 214 constant or near constant prevents quantization noise associated with a DAC from dominating the transmitter noise floor.

The charge on the capacitors 210, 212 may leak through parasitics on the silicon (i.e.—the reverse biased diode junction of the switch 206). In an embodiment, a periodic refresh is used to keep the voltage at a constant value. In an embodiment, a programmable timer is used to determine how often the biquad 200 re-samples the DAC output 201. In another embodiment, the timer is reset when the RFID transceiver is not operating in CW mode.

Figure 3:
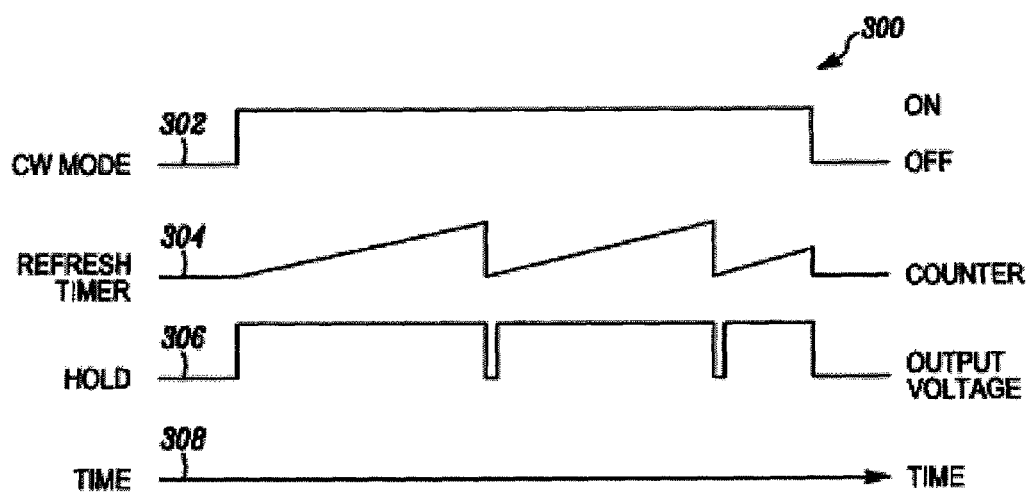
FIG. 3 is a timing diagram of a hold/refresh mechanism, according to but one embodiment.

FIG. 3 is a timing diagram 300 of a hold/refresh mechanism, according to but one embodiment. In an embodiment, timing diagram 300 depicts activation of the hold/refresh mechanism including CW mode 302, refresh timer 304, hold mechanism 306, and time 308. Time 308 represents the passage of time in the direction of the arrow 308.

In an embodiment, a typical hold and refresh cycle 300 includes CW mode 302, which may be off or on as depicted. When the CW mode 302 is on, the RFID transceiver is transmitting a continuous wave (CW) signal, in one embodiment. In another embodiment, when the CW mode 302 is on, refresh timer 304 begins to count sequentially to a selected value whereupon the timer 304 resets and begins to count sequentially again in a periodic fashion. The periodicity or selected value upon which the timer 304 resets may be selected to ensure that output voltage 306 is held constant.

In an embodiment, hold mechanism 306 depicts a mostly constant output voltage when the CW mode 302 is on. Hold mechanism 306 includes brief lapses where the output voltage may temporarily drop and return to a constant output voltage. Such lapses may be concurrent with resets associated with refresh timer 304. In an embodiment, a programmable timer is used to determine how often the biquad re-samples the DAC output. In another embodiment, the timer is reset when the RFID transceiver is not operating in CW mode.

Figure 4:
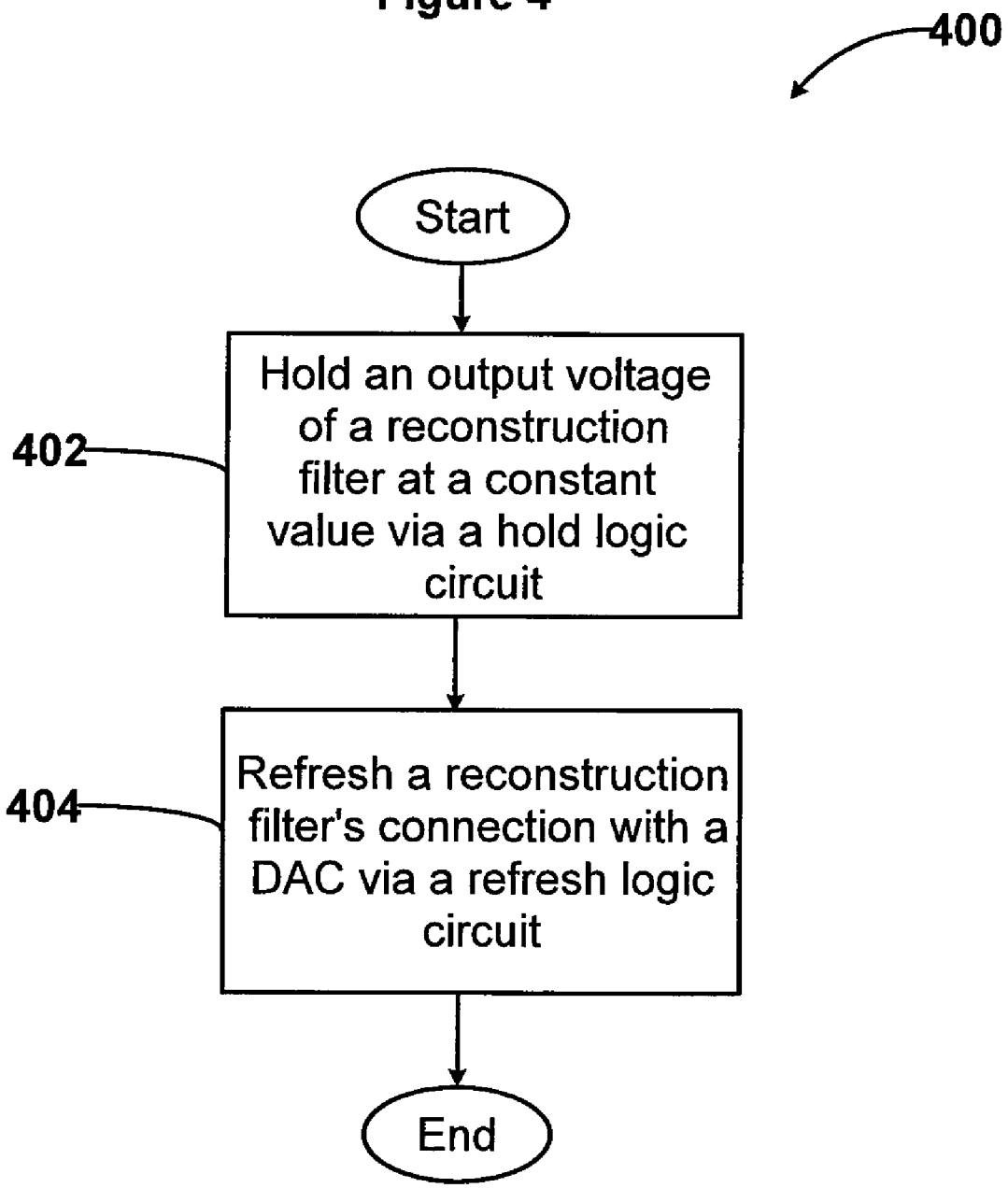
FIG. 4 is a flow diagram of a hold/refresh method, according to but one embodiment.

FIG. 4 is a flow diagram of a hold/refresh method 400, according to but one embodiment. In an embodiment, method 400 includes holding an output voltage of a reconstruction filter at a constant value via a hold logic circuit 402 and refreshing a reconstruction filter's connection with a DAC via a refresh logic circuit 404.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments. For example, refreshing a reconstruction filter's connection with a DAC via a refresh logic circuit 404 may be implemented prior to holding an output voltage of a reconstruction filter at a is constant value via a hold logic circuit 402 and vice versa.

In an embodiment, refreshing the filter connection 404 includes using a programmable timer to refresh the filter connection with the DAC by periodically reconnecting the reconstruction filter to the DAC. In another embodiment, holding 402 and refreshing 404 are implemented during continuous wave transmission from an RFID transceiver coupled with the DAC and turned off during AM transmission from the RFID transceiver.

In an embodiment, holding an output voltage 402 includes using a filter capacitor associated with the reconstruction filter to hold the output voltage of the reconstruction filter at an approximately constant value. In an embodiment, the filter capacitor is part of the reconstruction filter. In another embodiment, method 400 includes transmitting a continuous wave signal from an RFID transceiver coupled with a DAC using an omnidirectional antenna coupled with the RFID transceiver to transmit and receive a signal.

In other embodiments, the RFID transceiver, DAC, reconstruction filter, and other associated elements of method 400 accord with embodiments discussed and/or described in previous figures and embodiments.

Figure 5:
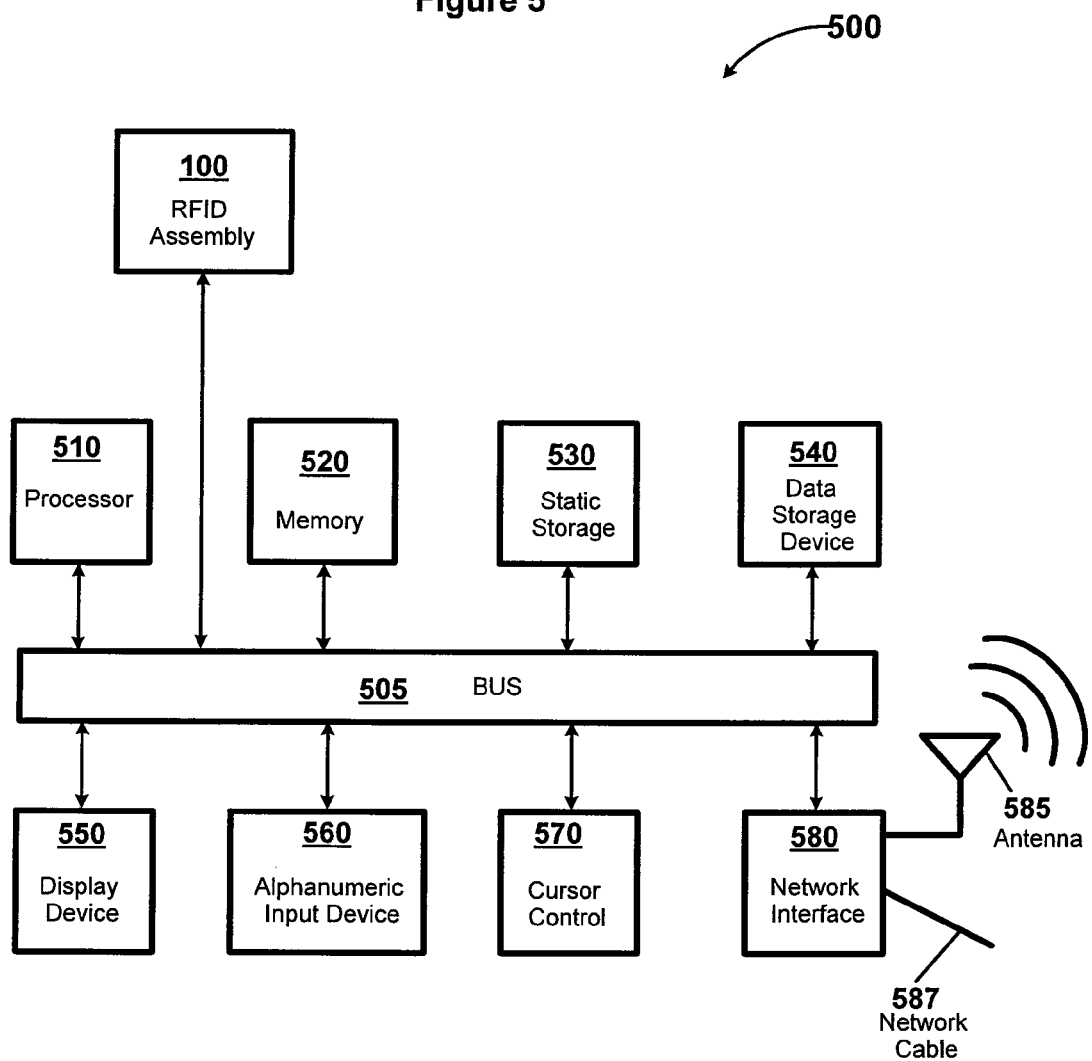
FIG. 5 is a diagram of an example system in which embodiments of the present invention may be used, according to but one embodiment.

FIG. 5 is a diagram of an example system in which embodiments of the present invention may be used, according to but one embodiment. System 500 is intended to represent a range of electronic systems (either wired or wireless) including, for example, desktop computer systems, laptop computer systems, personal computer (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 500 includes an RFID apparatus 100 that accords with apparatus 100 described in FIG. 1. In other embodiments, electronic system 500 is coupled with an RFID apparatus 100 that accords with embodiments already described for FIGS. 1-4.

Electronic system 500 may include bus 505 or other communication device to communicate information, and processor 510 coupled to bus 505 that may process information. While electronic system 500 is illustrated with a single processor, system 500 may include multiple processors and/or co-processors. System 500 may also include random access memory (RAM) or other storage device 520 (referred to as memory), coupled to bus 505 and may store information and instructions that may be executed by processor 510.

Memory 520 may also be used to store temporary variables or other intermediate information during execution of instructions by processor 510. Memory 520 is a flash memory device in one embodiment.

System 500 may also include read only memory (ROM) and/or other static storage device 530 coupled to bus 505 that may store static information and instructions for processor 510. Data storage device 540 may be coupled to bus 505 to store information and instructions. Data storage device 540 such as a magnetic disk or optical disc and corresponding drive may be coupled with electronic system 500.

Electronic system 500 may also be coupled via bus 505 to display device 550, such as a cathode ray tube (CRT) or liquid crystal display (LCD), to display information to a user. Alphanumeric input device 560, including alphanumeric and other keys, may be coupled to bus 505 to communicate information and command selections to processor 510. Another type of user input device is cursor control 570, such as a mouse, a trackball, or cursor direction keys to communicate information and command selections to processor 510 and to control cursor movement on display 550.

Electronic system 500 further may include one or more network interfaces 580 to provide access to network, such as a local area network. Network interface 580 may include, for example, a wireless network interface having antenna 585, which may represent one or more antennae. Network interface 580 may also include, for example, a wired network interface to communicate with remote devices via network cable 587, which may be, for example, an Ethernet cable, a coaxial cable, a fiber optic cable, a serial cable, or a parallel cable.

In one embodiment, network interface 580 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 11.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 580 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 500 includes one or more omnidirectional antennae 585, which may refer to an antenna that is at least partially omnidirectional and/or substantially omnidirectional, a processor 510 coupled to communicate via the antennae, and an RFID transceiver 100 coupled 520 with the processor.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of this description, as those skilled in the relevant art will recognize.

These modifications can be made in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus comprising:
   a radio frequency identification (RFID) wireless transceiver;
   a digital-analog converter (DAC) coupled with the transceiver;
   a reconstruction filter coupled with the digital-analog converter;
   hold logic associated with the reconstruction filter to enable the reconstruction filter to hold its output voltage;
   and refresh logic associated with the reconstruction filter to periodically refresh the reconstruction filter connection with the DAC.

2. An apparatus according to claim 1 wherein the refresh logic comprises a programmable timer to refresh the reconstruction filter by periodically reconnecting the reconstruction filter to the DAC.

3. An apparatus according to claim 1 wherein the hold logic and the refresh logic are implemented when the transceiver is in continuous wave mode.

4. An apparatus according to claim 1 wherein the reconstruction filter comprises a filter capacitor, the capacitor being used to hold the output voltage of the reconstruction filter at an approximately constant value.

5. An apparatus according to claim 1 wherein the DAC is a delta-sigma DAC.

6. An apparatus according to claim 1 further comprising:
   an omnidirectional antenna coupled with the transceiver to transmit and receive a signal; and
   a processor coupled with the transceiver to communicate via the antenna.

7. A method comprising:
   holding an output voltage of a reconstruction filter at a constant value via a hold logic circuit, the reconstruction filter being coupled to a digital to analog converter (DAC) and a radio frequency identification (RFID) wireless transceiver;
   and refreshing the reconstruction filter connection with the DAC via a refresh logic circuit.

8. A method according to claim 7 wherein refreshing the filter connection comprises using a programmable timer to refresh the filter connection with the DAC by periodically reconnecting the reconstruction filter to the DAC.

9. A method according to claim 7 wherein holding and refreshing are implemented during continuous wave transmission from a wireless transceiver coupled with the DAC.

10. A method according to claim 7 wherein holding an output voltage of a reconstruction filter comprises using a filter capacitor associated with the reconstruction filter to hold the output voltage of the reconstruction filter at an approximately constant value.

11. A method according to claim 7 wherein the DAC is a delta-sigma DAC.

12. A method according to claim 7 further comprising:
transmitting a continuous wave signal from an RFID transceiver coupled with the DAC using an omnidirectional antenna coupled with the RFID transceiver to transmit and receive a signal.

* * * * *